US006414245B1

(12) United States Patent
Lopp et al.

(10) Patent No.: US 6,414,245 B1
(45) Date of Patent: Jul. 2, 2002

(54) PRINTED CIRCUIT BOARD WITH BULLET CONNECTOR SOCKETS

(75) Inventors: Darren S. Lopp, Westland; William F. Reuss, Lodi; Gary G. Siegmund, Westland, all of OH (US)

(73) Assignee: Marconi Communications, Inc., Cleveland, OH (US)

( * ) Notice: Subject to any disclaimer, the term of this patent is extended or adjusted under 35 U.S.C. 154(b) by 0 days.

(21) Appl. No.: 09/726,364

(22) Filed: Nov. 30, 2000

(51) Int. Cl.[7] .................................................. H05K 1/03

(52) U.S. Cl. ....................... 174/255; 174/255; 174/260; 361/632; 361/634; 361/652; 361/656

(58) Field of Search ................................. 174/261, 262, 174/263, 264, 255, 260; 361/826, 634, 652, 656; 200/293

(56) References Cited

U.S. PATENT DOCUMENTS 3,818,168 A * 6/1974 Norden ........................ 200/293
5,179,491 A * 1/1993 Runyan ........................ 361/18
5,712,779 A * 1/1998 Sheppard et al. ............. 363/69
5,869,907 A * 2/1999 Marler ........................ 361/826

* cited by examiner

*Primary Examiner*—Albert W. Paladini
(74) *Attorney, Agent, or Firm*—Jones, Day, Reavis & Pogue

(57) ABSTRACT

A printed circuit board having bushings attached thereto, the bushings having sockets for receiving bullet connectors on a circuit breaker.

21 Claims, 5 Drawing Sheets

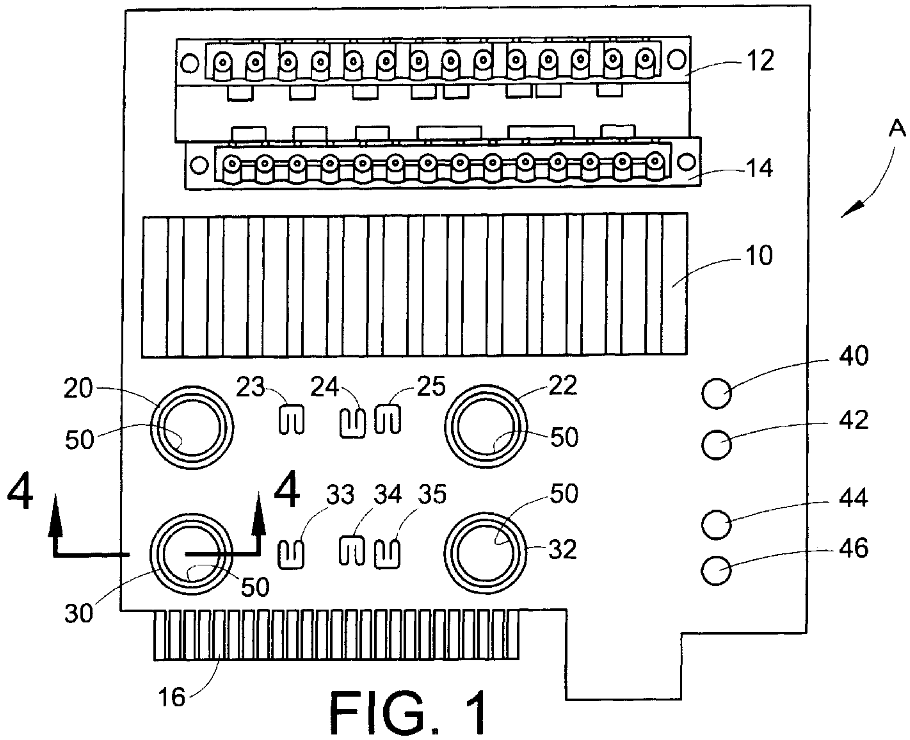
FIG. 1
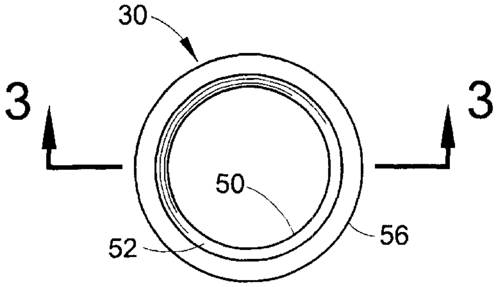
FIG. 2
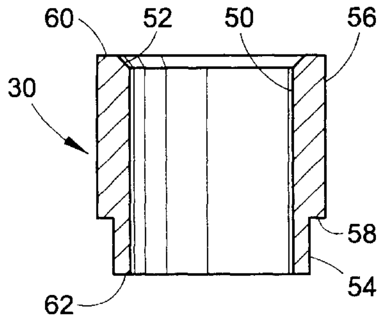
FIG. 3
FIG. 4
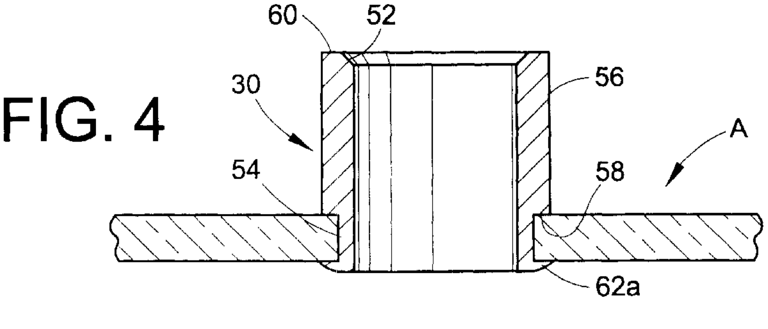
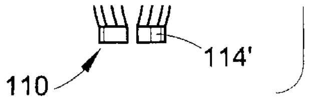

PRINTED CIRCUIT BOARD WITH BULLET CONNECTOR SOCKETS

BACKGROUND OF THE INVENTION

This application relates to the art of telecommunications and, more particularly, to printed circuit boards through which DC power is supplied to telecommunications equipment. Although the invention is particularly applicable to telecommunications and will be described with specific reference thereto, it will be appreciated that the invention has broader aspects and can be used on printed circuit boards having other uses.

Printed circuit boards for providing DC power to telecommunications equipment commonly have circuit breakers mounted thereon in a manner that makes removal and replacement very difficult. It would be desirable to have an arrangement for quickly connecting circuit breakers to a printed circuit board and for quickly removing same.

SUMMARY OF THE INVENTION

In accordance with the present application, a printed circuit board has sockets thereon for receiving bullet connectors on a circuit breaker.

In one arrangement, the sockets on the printed circuit board are provided by cylindrical bushings that are attached to the printed circuit board and have sockets therein for receiving the bullet connectors.

The bushings have a small diameter cylindrical mounting portion and a large diameter cylindrical socket portion. The mounting portion is extended through a hole in the printed circuit board and swaged or spun over on the opposite side thereof. Solder is applied around the periphery of the bushing on both sides of the printed circuit board in any suitable manner such as by wave soldering.

It is a principal object of the present invention to provide an improved arrangement for attaching circuit breakers to a printed circuit board.

It is another object of the invention to provide an improved printed circuit board having sockets thereon for receiving bullet connectors on a circuit breaker.

BRIEF DESCRIPTION OF THE DRAWING

FIG. 1 is a plan view of the component side of a printed circuit board having sockets thereon for receiving bullet connectors;

FIG. 2 is a top plan view of a bushing that is used to provide the printed circuit board with sockets for receiving bullet connectors;

FIG. 3 is a cross-sectional elevational view taken generally on line 3—3 of FIG. 2;

FIG. 4 is a partial cross-sectional elevational view taken generally on line 4—4 of FIG. 1;

DESCRIPTION OF A PREFERRED EMBODIMENT

Figure 5:
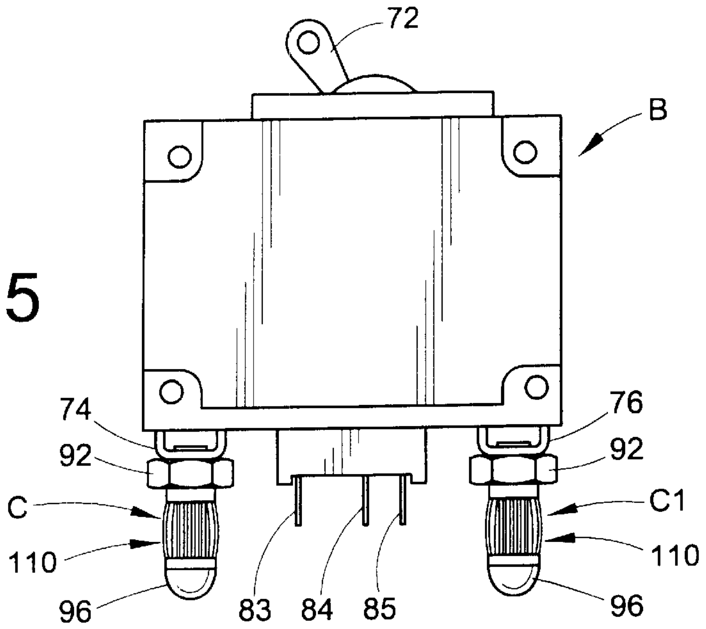
FIG. 5 is a side-elevational view of a circuit breaker having bullet connectors thereon for reception in the socket os FIGS. 2–4.

Referring now to the drawing, wherein the showings are for purposes of illustrating a preferred embodiment of the invention only and not for purposes of limiting same, FIG. 1 shows a printed circuit board A having a plurality of side-by-side fuses 10 thereon through which power is supplied to terminal blocks 12, 14. Telecommunications equipment is connected to a power supply through fuses 10 by way of terminal blocks 12, 14. A plurality of. spaced-apart side-by-side gold contacts 16 are arranged along one side of printed circuit board A for connection to a DC power supply and to other circuitry.

A first pair of spaced-apart socket members 20, 22 are attached to printed circuit board A for receiving bullet connectors on a circuit breaker. Female contacts 23, 24 and 25 receive male blade contacts on the circuit breaker for operating an alarm circuit within the breaker. A second pair of socket members 30, 32 are attached to printed circuit board A closely adjacent socket members 20, 22. Bullet connectors on a second circuit breaker are received in socket members 30, 32 for supplying power therethrough. Female contacts 33, 34 and 35 are provided for receiving male blade contacts on the circuit breaker to operate an alarm circuit within the breaker.

DC power is supplied by way of a plurality of the gold contacts 20 and a conductive coating on the component side of board A to positive leads 40 and 44 that connect to a load. Negative leads 42 and 46 provide a return path from the load and are connected with conductive coatings on the trace side of the board that in turn are connected with socket members 22 and 32. The negative return path is from socket members 22 and 32, through the circuit breakers connected therewith to socket members 20 and 30, and through a conductive coating on the trace side of the board that is connected to the negative side of the DC power source through a plurality of the gold contacts 20.

FIGS. 2–4 show generally cylindrical socket member 30 as being in the form of a bushing having a cylindrical hole 50 therethrough to form a socket for receiving a bullet connector. The entrance to socket 50 may be chamfered as generally indicated at 52 to facilitate insertion of a bullet connector. Socket member or bushing 30 includes a small diameter cylindrical mounting portion 54 and a large diameter cylindrical socket portion 56. The small and large diameter mounting portion and socket portion intersect at a horizontal circumferential shoulder 58. Socket member or bushing 30 has top and bottom ends 60, 62.

Referring to FIG. 4, a suitable circular hole is provided in printed circuit board A for closely receiving small diameter mounting portion 58 of socket member 30. The distance from shoulder 58 to socket member end 62 is greater than the thickness of printed circuit board A so that end 62 can be swaged, spun or otherwise deformed outwardly as generally indicated at 62*a* in FIG. 4. This locks socket member 30 to printed circuit board A by trapping the board between shoulder 58 and outwardly swaged portion 62*a* 20 around the periphery of the hole in the printed circuit board. Solder also is applied around the periphery of socket member 30 at shoulder 58 and at swaged portion 62*a* as by wave soldering. The other socket members are attached to the board in the same manner.

FIG. 5 shows a circuit breaker B having a toggle 72 for tripping and resetting the circuit breaker. Generally U-shaped connecting members 74, 76 project from circuit breaker B and have bullet connectors C, C1 attached thereto. Male contact blades 83, 84 and 85 project from circuit breaker B between bullet connectors C and C1 for reception in female contacts 23–25 or 33–35 on printed circuit board A.

Figure 6:
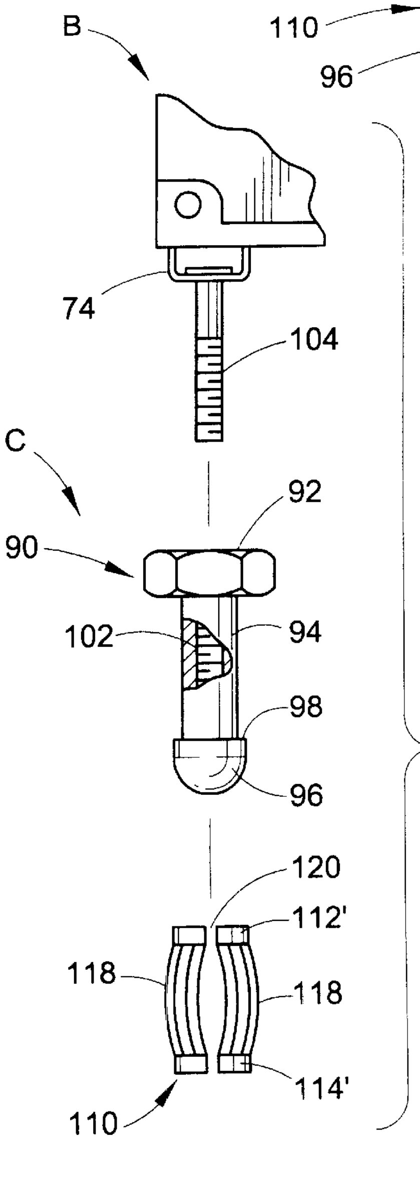
FIG. 6 is an exploded side-elevational view of a bullet connector.
Figure 7:
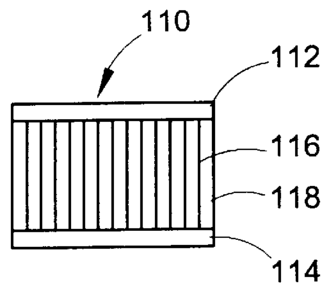
FIG. 7 is a plan view of a contact member used with the bullet connector of FIG. 6.

Referring now to FIGS. 6 and 7, a bullet connector C includes a pin member 90 having an enlarged hexagonal head 92 with a cylindrical shank 94 extending therefrom and terminating in an enlarged rounded bullet nosed tip 96. An outwardly extending shoulder 98 is defined between cylindrical shank 94 and rounded bullet nosed tip 96. A central threaded bore 102 is provided in pin 90 for receiving a screw or threaded stud 104 to attach a bullet connector to a circuit breaker. Obviously, screw 104 may be permanently attached to connecting members 74, 76 on circuit breaker B.

FIG. 7 shows a flat spring metal blank 110 of a suitable material such as beryllium copper. The blank has flat opposite end portions 112 and 114 between which a plurality of parallel slits 116 are formed to provide a plurality of individual spring contacts 118 therebetween. The slits actually have a width that is not shown in the drawing by removal of a small amount of metal from the strip so that the spring contacts are slightly spaced from one another. Spring contacts 118 are bowed outwardly as shown in FIG. 6, and the blank of FIG. 7 is formed into a cylinder with cylindrical end portions 112' and 114' having an internal diameter slightly smaller than the external diameter of cylindrical shank 94. A narrow longitudinal split 120 in contact member 110 permits outward expansion thereof when one of its open ends is pushed against bullet nose 96 so that contact member 110 can be moved into surrounding relationship with cylindrical shank 94 until the contact member clears shoulder 98 and snaps closed around shank 94 with cylindrical contact portions 112', 114' in firm gripping relationship therewith.

The length between the opposite outer ends of end portions 112', 114' is slightly less than the distance from shoulder 98 to the underside of hexagonal head 92. The outer diameter of outwardly bowed spring contacts 118 is larger than the diameter of cylindrical sockets 50 in each socket member so that the bullet connectors must be forced into the sockets with a tight fit for good electrical contact. This also causes cylindrical end portions 112', 114' on connector member 110 to contract into firm engagement with cylindrical shank 94 on bullet connector pin 90.

The socket members preferably are made of tin plated half-hard brass although it will be recognized that other materials may be used for some purposes. The socket members also may be made in different sizes depending on the size of the bullet connectors and dimensions will be provided simply by way of example for the preferred arrangement that is described. Socket member 30 has a length between ends 60, 62 of 10.69 millimeters. Cylindrical socket 50 has a diameter of 7.92 millimeters. Mounting portion 54 has an external diameter of 9.53 millimeters. Socket portion 56 has an outer diameter of 11.10 millimeters. Socket portion 56 has a length between end 60 and shoulder 58 of 7.92 millimeters. Mounting portion 54 has a length between shoulder 58 and end 62 of 2.77 millimeters.

Figure 8:
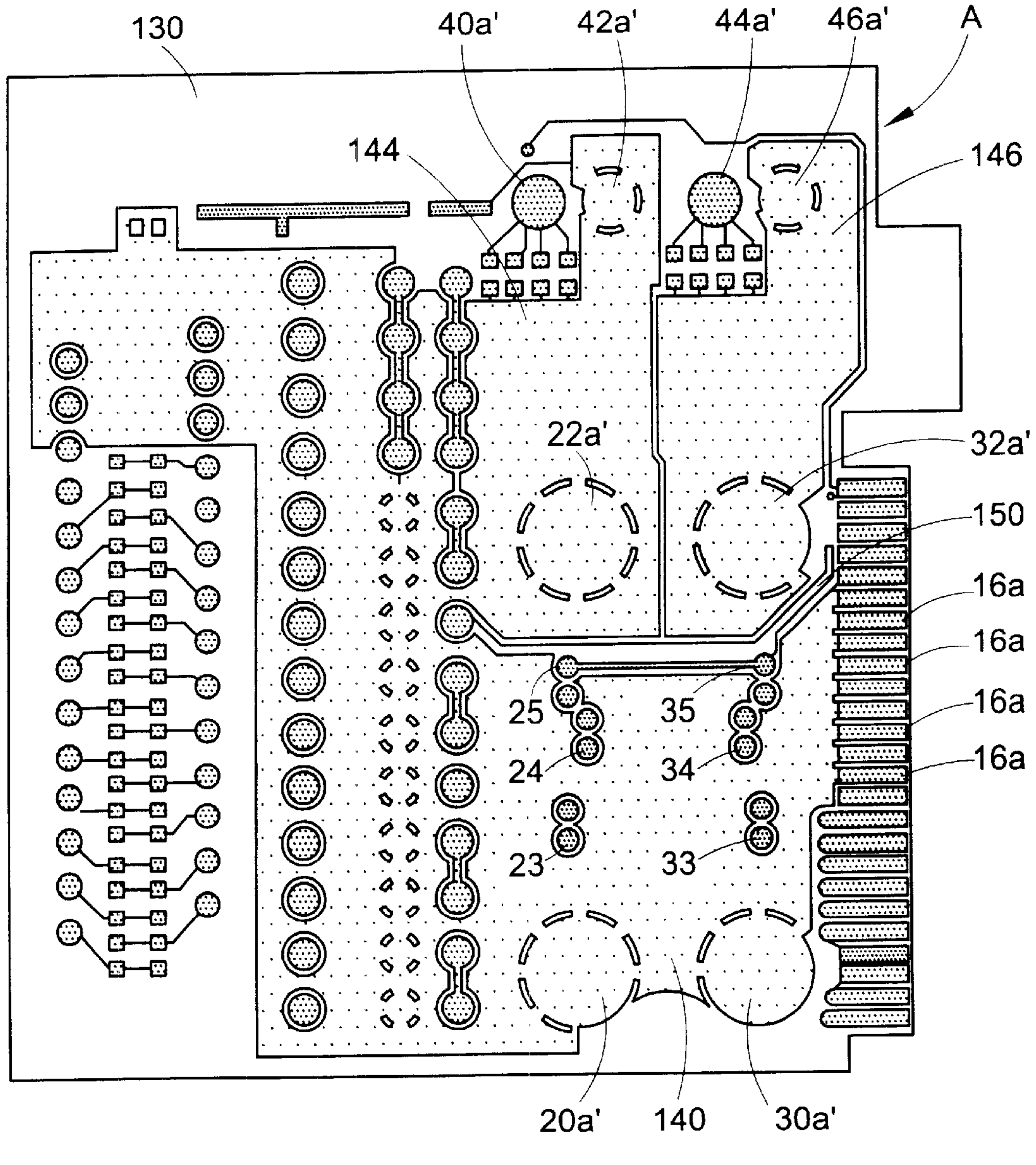
FIG. 8 is a plan view of the trace side of a printed circuit board.
Figure 9:
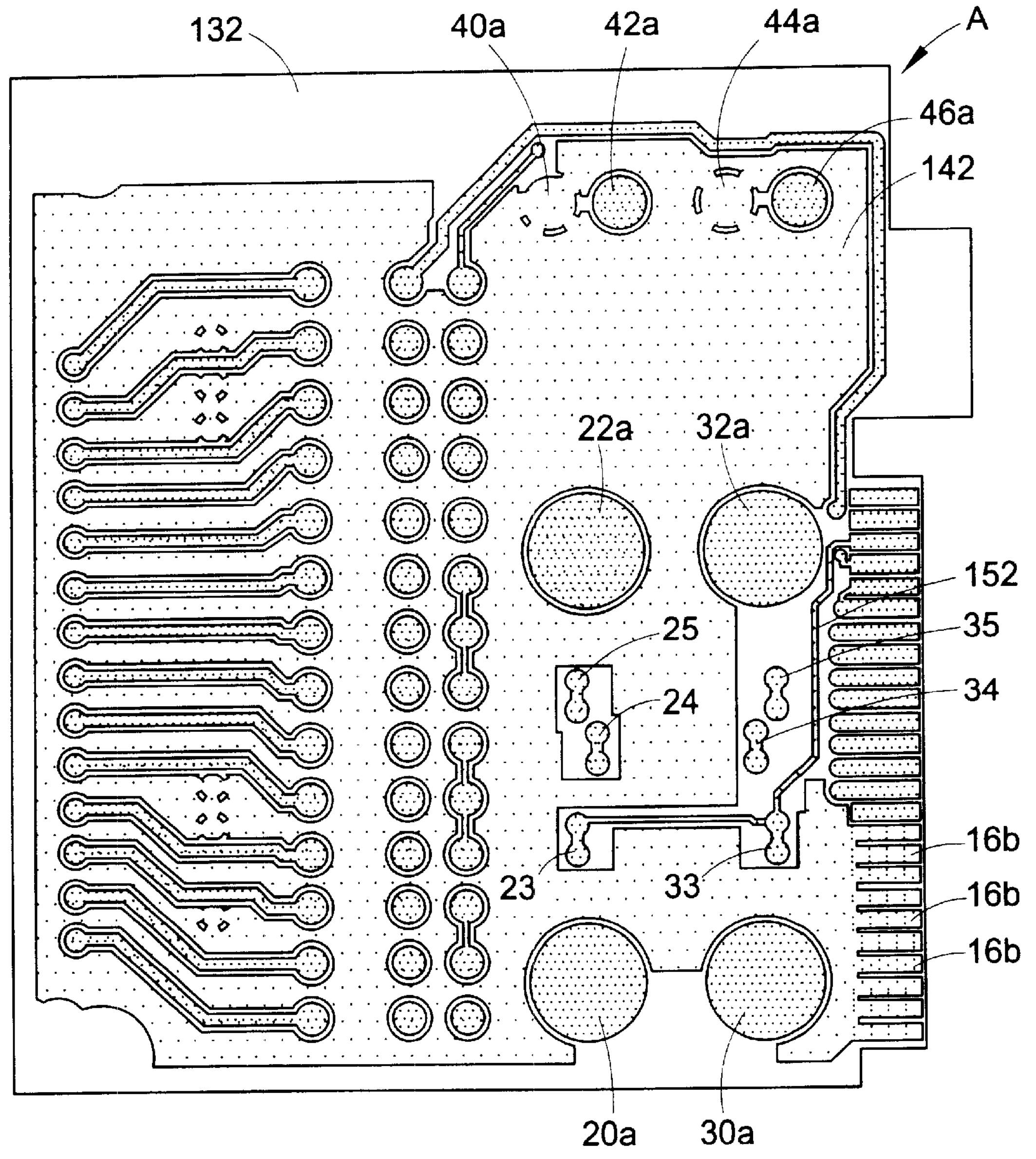
FIG. 9 is a plan view of the component side of the printed circuit board.

FIG. 8 shows fiberglass/plastic printed circuit board A having a bottom surface 130 on the trace side of the board. FIG. 9 shows the same board having a top surface 132 on the component side of the board. The stippled areas in FIGS. 8 and 9 represent electrically conductive coatings on the top and bottom surfaces of the board. FIGS. 8 and 9 show the printed circuit board before the holes are formed therein for receiving the socket members and other printed circuit board components.

In FIG. 9, circular areas 20*a* and 22*a* represent the areas where circular holes are formed in printed circuit board A for receiving the mounting portions of socket members 20 and 22. Circular areas 30*a* and 32*a* represent areas of the board where circular holes are formed for receiving mounting portions of socket members 30 and 32. The same areas on the bottom or trace side of the board are represented by numerals 20*a*', 22*a*', 30*a*' and 32*a*' in FIG. 8.

Conductive area 140 in FIG. 8 on the trace side of the board is in engagement with socket members 20, 30 and with a plurality of the gold contacts 16*a* that are connected with the negative side of a DC power source. All of the socket members 20, 22, 30 and 32 are isolated from the conductive coating 142 on the top or component side of printed circuit board A. However, conductive area 142 on the top or component side of the board is connected through a plurality of the gold contacts 16*b* with the positive side of the DC power source. Conductive area 142 also is connected with positive leads 40 and 44 of FIG. 1 as represented by circular areas 40*a* and 44*a* in FIG. 9.

As shown in FIG. 8, conductive area 144 is connected with socket member 22 and with negative lead 42*a*' on the trace side of the board. Conductive area 146 is isolated from conductive area 144, and is connected with socket member 32 on the trace side of the board and with negative lead 46*a*' on the trace side of the board. Thus, power is supplied through the circuit breakers from gold contacts 16*b* that are connected with the positive side of a DC power source, through conductive area 142 on the component side of the board to positive leads 40 and 44, through the load that is connected with leads 40 and/or 44, from the load back through negative leads 42 and 46, through conductive areas 144 and 146 on the trace side of the board to socket members 22 and 32, through the circuit breakers to socket members 20 and 30, and through conductive coating 140 on the trace side of the board to contacts 16*a* that are connected to the negative side of the DC power source. Tripping of a circuit breaker opens the normally open alarm circuit through circuit breaker leads 83 and 85 to activate an audible or visual alarm.

Female alarm contacts 25, 35 are connected with one another and are connected by a trace 150 to the positive side of a DC power source by one of gold contacts 20. Female contacts 24, 34 are dummy contacts in this arrangement because the circuit breakers have a normally circuit for open blade 84 and a normally closed circuit for blade 85. In the arrangement shown and described, the normally closed alarm circuit in the circuit breaker is used so that male blades 85 are in use while blade 84 and the contacts 24, 34 receiving same are dummies. Alarm circuit contacts 23, 33 are connected with one another and are connected to the negative side of the DC power source by one of gold contacts 20 and a lead 152.

Figure 10:
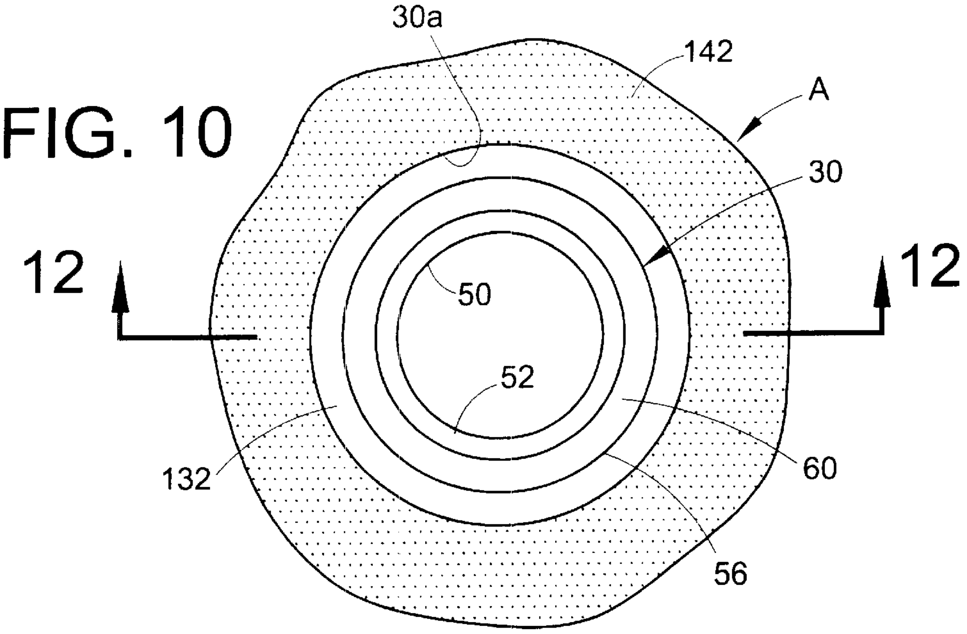
FIG. 10 is a partial plan view of the component side of a printed circuit board showing a socket member for receiving a bullet connector.

FIG. 10 shows a socket member 30 secured to printed circuit board A within circular area 30*a* inwardly from conductive coating 142 on the component side of the printed circuit board.

Figure 11:
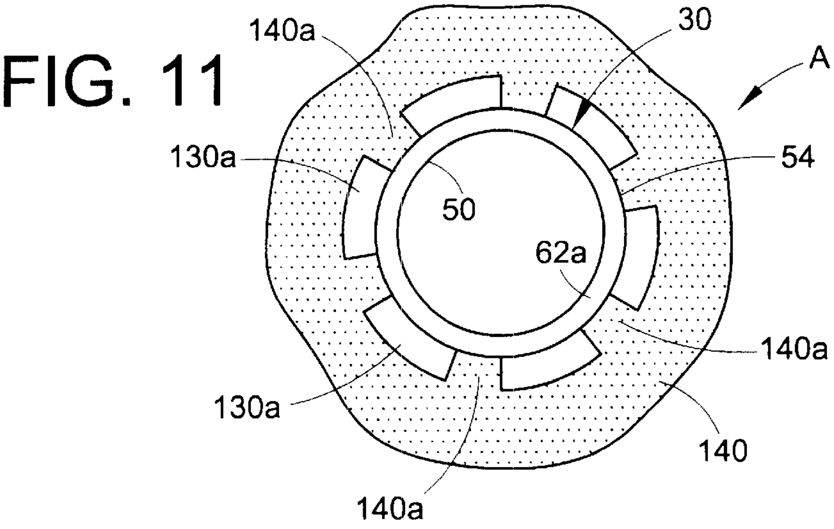
FIG. 11 is a partial plan view of the trace side of the printed circuit board showing a socket member for receiving a bullet connector.

FIG. 11 shows the trace side of printed circuit board A with outwardly swaged end portion 62*a* of bushing 30 in conductive engagement with conductive spokes 140*a* of conductive coating 140. Spokes 140*a* are provided in circumferentially-spaced relationship to expose spaced areas 130*a* of the board surface to facilitate soldering. The periphery of the holes in the board for receiving the bushings are copper plated and solder is applied on both the component and trace sides of the board around the bushings. The solder flows through the holes in the printed circuit boards around the mounting portions of the bushings and under the shoulders thereon to solder the mounting portions of the bushings to the peripheral surfaces of the board holes and connect the bushings with selected conductive coatings on the board.

Figure 12:
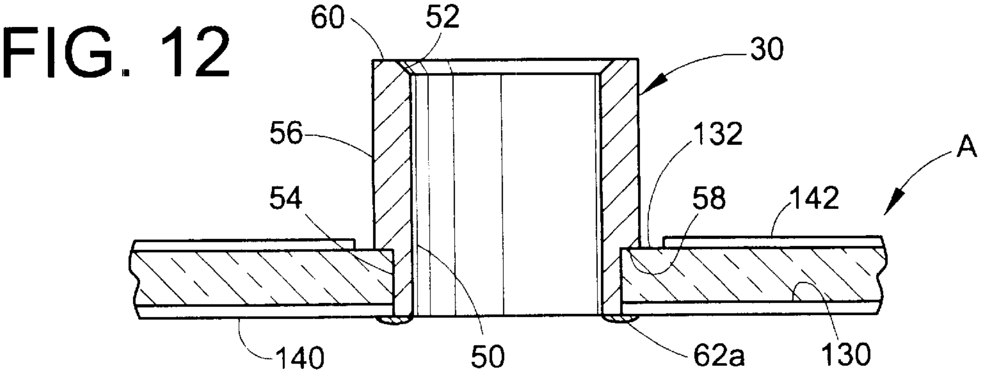
FIG. 12 is a cross-sectional elevational view taken generally on line 12—12 of FIG. 10.

FIG. 12 shows bushing 30 having its mounting portion 54 extending through a circular hole in printed circuit board A. As shown, conductive coating 142 on the top or component side of the board is isolated from bushing 30 while conductive coating 140 on the bottom or trace side of the board is in engagement with swaged end portion 62 of the bushing and with the solder that is applied around the swaged end portion. The solder that is applied around the bushing is not shown but does not engage the conductive coating 142 on the component side of the board. The other bushings are similarly attached to the board. Bushings 20 and 30 engage the conductive coating 140 on the trace side of the board, while bushings 22 and 32 respectively engage conductive areas 144 and 146 on the trace side of the board. The board connections for the fuse sockets and the terminal blocks are made in a known manner.

Although the invention has been shown and described with reference to a preferred embodiment, it is obvious that equivalent alterations and modifications will occur to others skilled in the art upon the reading and understanding of the specification. The present invention includes all such equivalent alterations and modifications, and is limited only by the scope of the claims.

We claim:

1. A printed circuit board having at least one pair of spaced-apart bushings soldered thereto, said bushings having cylindrical sockets therein for receiving bullet connectors on a circuit breaker.

2. The printed circuit board of claim 1 wherein each of said bushings is cylindrical and has a small diameter cylindrical mounting portion and a large diameter cylindrical socket portion, said mounting portion and said socket portion intersecting at a shoulder, said circuit board having circular holes therethrough receiving said mounting portions of said bushings, and said circuit board having a board surface engaged by said bushing shoulders.

3. The printed circuit board of claim 1 wherein said board has power source and load coatings on one side thereof that are electrically isolated from one another, one bushing in said pair of bushings being in electrically conductive relationship with said power source conductive coating and the other bushing in said pair of bushings being in electrically conductive relationship with said load conductive coating, said bushings providing a conductive path between said power source and load conductive coatings through a circuit breaker that is plugged into said bushings with bullet connectors.

4. The printed circuit board of claim 1 wherein said sockets extend completely through said bushings and have socket entrance openings that are chamfered.

5. The printed circuit board of claim 1 including a circuit breaker having a pair of bullet connectors thereon received in said sockets.

6. The printed circuit board of claim 5 wherein each said bullet connector includes a pin having a rounded bullet nose and a cylindrical shank portion, a generally cylindrical spring contact member surrounding said shank portion, said spring contact member having a plurality of longitudinally extending circumferentially-spaced spring contacts thereon, said spring contacts being outwardly bowed and dimensioned for tightly fitting in said sockets.

7. A printed circuit board having at least two pair of side-by-side socket members thereon, said socket members having cylindrical sockets therein for receiving bullet connectors on circuit breakers.

8. The printed circuit board of claim 7 wherein each said socket member comprises a generally cylindrical bushing having a small diameter cylindrical mounting portion and a large diameter cylindrical socket portion, said printed circuit board having holes therethrough closely receiving said mounting portion on each of said bushings.

9. The printed circuit board of claim 8 wherein said mounting portions extend through the holes in the printed circuit board and have mounting portion ends outwardly deformed on the opposite side of said printed circuit board from said socket portions.

10. The printed circuit board of claim 8 wherein said bushings are soldered to said board.

11. The printed circuit board of claim 7 wherein said cylindrical sockets extend completely through said socket members.

12. The printed circuit board of claim 7 wherein said board has a trace side and a component side, a component side conductive coating on said component side of said board, component side power source contacts connected with said component side conductive coating, component side load leads connected with said component side conductive coating, all of said bushings being electrically isolated from said component side conductive coating, said trace side having a trace side power source coating connected with trace side power source one socket member in each of said pair or socket members being electrically connected with said trace side power source coating, a pair of trace side load coatings on said trace side of said board, said pair of trace side load coatings being electrically isolated from said trace side power source coating and from one another, each of said trace side lead coatings having a trace side load lead connected thereto, each of said trace side load coatings having one of said socket members electrically connected therewith, whereby circuit breakers spanning each of said pair of socket members between said trace side power source coating and said trace side load coatings provide a continuous conductive path from said component side power source contacts to said component side conductive coating, then to said component side load leads to a load, then back from the load to said trace side load leads and said trace side load coatings, then to the socket members connected with the trace side load coatings, then through the circuit breakers to the socket members connected with the trace side power source coating and to said trace side power source contacts.

13. The printed circuit board of claim 12 wherein said component side power source contacts are positive DC and said trace side power source contacts are negative DC.

14. A printed circuit board having a component side and a trace side, a component side conductive coating connected with positive DC power source contacts, at least one positive load lead connected with said component side conductive coating, a trace side power source conductive coating connected with negative DC power source contacts, at least one trace side load coating electrically isolated from said trace side power source conductive coating and connected with a negative load lead, a first socket member attached to said board and connected with said trace side power source conductive coating, a second socket member attached to said board and connected with said trace side load coating, both of said socket members being electrically isolated from said component side conductive coating, said socket members having sockets therein for receiving connectors on a circuit breaker that spans and connects said socket members, whereby a continuous conductive path is provided from said positive power source contacts to said component side conductive coating and to a load through said positive load lead, then from the load back to the negative load lead to the trace side load conductive coating and to the second socket member, then from the second socket member to the first socket member through a circuit breaker spanning the socket members, then from the first socket member to the trace side power source coating and to the negative power source contacts.

15. The printed circuit board of claim 14 wherein said socket members extend outwardly from said component side of said board and said sockets receive connectors on a circuit breaker located on said component side of said board.

16. The printed circuit board of claim 14 wherein said socket members have cylindrical sockets therein for receiving bullet connectors on a circuit breaker.

17. The printed circuit board of claim 16 wherein said socket members are cylindrical and include small diameter cylindrical mounting portions and large diameter cylindrical socket portions, said board having circular holes therethrough receiving said cylindrical mounting portions which are soldered to said trace side power source coating while said large diameter cylindrical socket portions extend outwardly from said component side of said board.

18. The printed circuit board of claim 17 wherein said cylindrical mounting portions are outwardly deformed on said trace side of said board.

19. A printed circuit board having electrically isolated power source and load conductive coatings on one side thereof, at least one bushing attached to said board in electrically conductive relationship with each of said conductive coatings, said bushings having cylindrical sockets therein for receiving bullet connectors on a circuit breaker to provide a conductive path between the power source and load conductive coatings through the bushings and the circuit breakers.

20. The printed circuit board of claim 19 wherein said board has a circular hole therethrough within each of said power source and load conductive coatings, each said bushing having a small diameter cylindrical mounting portion received in one of said holes and secured to said board, and each said bushing having a large diameter socket portion.

21. The printed circuit board of claim 20 wherein said large diameter socket portion is located on the opposite side of said board from said power source and load conductive coatings and said cylindrical sockets extend completely through said bushings.

* * * * *